(12) United States Patent
Shiino et al.

(10) Patent No.: US 8,270,220 B2
(45) Date of Patent: Sep. 18, 2012

(54) NONVOLATILE SEMICONDUCTOR STORAGE DEVICE AND METHOD FOR CONTROLLING THE SAME

(75) Inventors: Yasuhiro Shiino, Fujisawa (JP); Atsuhiro Sato, Tokyo (JP); Takeshi Kamigaichi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 296 days.

(21) Appl. No.: 12/729,626

(22) Filed: Mar. 23, 2010

(65) Prior Publication Data

US 2010/0246255 A1  Sep. 30, 2010

(30) Foreign Application Priority Data

Mar. 30, 2009 (JP) ................................. 2009-082856

(51) Int. Cl.
*G11C 16/06* (2006.01)
(52) U.S. Cl. ................................ 365/185.2; 365/185.18
(58) Field of Classification Search ............... 365/185.2, 365/210.1, 185.18
See application file for complete search history.

(56) References Cited

U.S. PATENT DOCUMENTS

| | | | |
|---|---|---|---|
| 6,353,242 B1 * | 3/2002 | Watanabe et al. | ............. 257/316 |
| 2008/0055978 A1 | 3/2008 | Ishibashi et al. | |
| 2008/0130363 A1 | 6/2008 | Hosono | |
| 2009/0057814 A1 | 3/2009 | Izumi et al. | |

FOREIGN PATENT DOCUMENTS

| | | |
|---|---|---|
| JP | 7-30000 | 1/1995 |
| JP | 2008-60421 | 3/2008 |

OTHER PUBLICATIONS

Japanese Office Action issued Jul. 15, 2011, in Patent Application No. 2009-082856 (with English-language translation).

* cited by examiner

*Primary Examiner* — Huan Hoang
(74) *Attorney, Agent, or Firm* — Oblon, Spivak, McClelland, Maier & Neustadt, L.L.P.

(57) ABSTRACT

A nonvolatile semiconductor storage device includes a memory cell array and a peripheral circuit. The memory cell array includes active areas extending in a first direction, a dummy active area extending in the first direction, memory cells on the plurality of active areas, first dummy cells on the dummy active area, diffusion layer areas each connected to the corresponding memory cell and the corresponding first dummy cell, first contacts in the respective active areas, and a second contact in the dummy active area. The peripheral circuit includes a voltage applying unit configured to apply to each of the first contacts a first voltage to set each of the memory cells in a write enable state or a second voltage to set the memory cells in a write inhibit state, and to apply to the second contact a third voltage to change a threshold of the dummy cell.

19 Claims, 7 Drawing Sheets

US 8,270,220 B2

NONVOLATILE SEMICONDUCTOR STORAGE DEVICE AND METHOD FOR CONTROLLING THE SAME

CROSS-REFERENCE TO RELATED APPLICATION

This application is based upon and claims the benefit of priority from the prior Japanese Patent Application No. 2009-82856, filed on Mar. 30, 2009; the entire contents of which are incorporated herein by reference.

BACKGROUND OF THE INVENTION

1. Field of the Invention

The present invention relates to a nonvolatile semiconductor storage device and a method for controlling the same, particularly to a nonvolatile semiconductor storage device used in a flash EEPROM (Electrically Erasable and Programmable Read Only Memory) and a method for controlling the same.

2. Related Art

Ordinarily IPD (Inter-Poly Dielectric) breakdown that is a factor degrading reliability of a nonvolatile semiconductor storage device is a problem.

A conventional NAND flash memory is configured such that a dummy cell disposed in an end portion of a memory cell array becomes a floating state in programming operation (see JP-A No. 2008-60421 (Kokai)).

However, when a program-erase cycle is repeated in a memory cell, charges of the dummy cell increase. Therefore, a threshold of the dummy cell is lowered. As a result, the IPD breakdown of the dummy cell is caused.

BRIEF SUMMARY OF THE INVENTION

According to a first aspect of the present invention, there is provided a nonvolatile semiconductor storage device comprising:

a memory cell array comprising a plurality of active areas extending in a first direction, a dummy active area extending in the first direction, a plurality of memory cells on the plurality of active areas, a plurality of first dummy cells on the dummy active area, a plurality of diffusion layer areas each connected to the corresponding memory cell and the corresponding first dummy cell, a plurality of first contacts in the respective active areas, and a second contact in the dummy active area; and a peripheral circuit comprising a voltage applying unit configured to apply to each of the first contacts a first voltage to set each of the memory cells in a write enable state or a second voltage to set the memory cells in a write inhibit state, and to apply to the second contact a third voltage to change a threshold of the dummy cell.

According to a second aspect of the present invention, there is provided a method for controlling a nonvolatile semiconductor storage device comprising a memory cell array comprising a plurality of active areas extending in a first direction, a dummy active area extending in the first direction, a plurality of memory cells on the plurality of active areas, a plurality of first dummy cells on the dummy active area, a plurality of diffusion layer areas connected to the corresponding memory cell and the corresponding first dummy cell, a plurality of first contacts in the plurality of active areas, and a second contact in the dummy active area, and the device connected to a memory cell controller, the method comprising:

applying a first voltage or a second voltage to each of the first contacts;

setting the second contact in a floating state;

erasing data of one of the memory cells and data of the first dummy cell; and applying the first voltage or the second voltage to each of the first contacts and the third voltage to the second contact after a control signal of the data programming in the memory cells is transmitted from the memory cell controller.

DETAILED DESCRIPTION OF THE INVENTION

Hereafter, embodiments of the present invention will be described more specifically with reference to the drawings.

Figure 1:
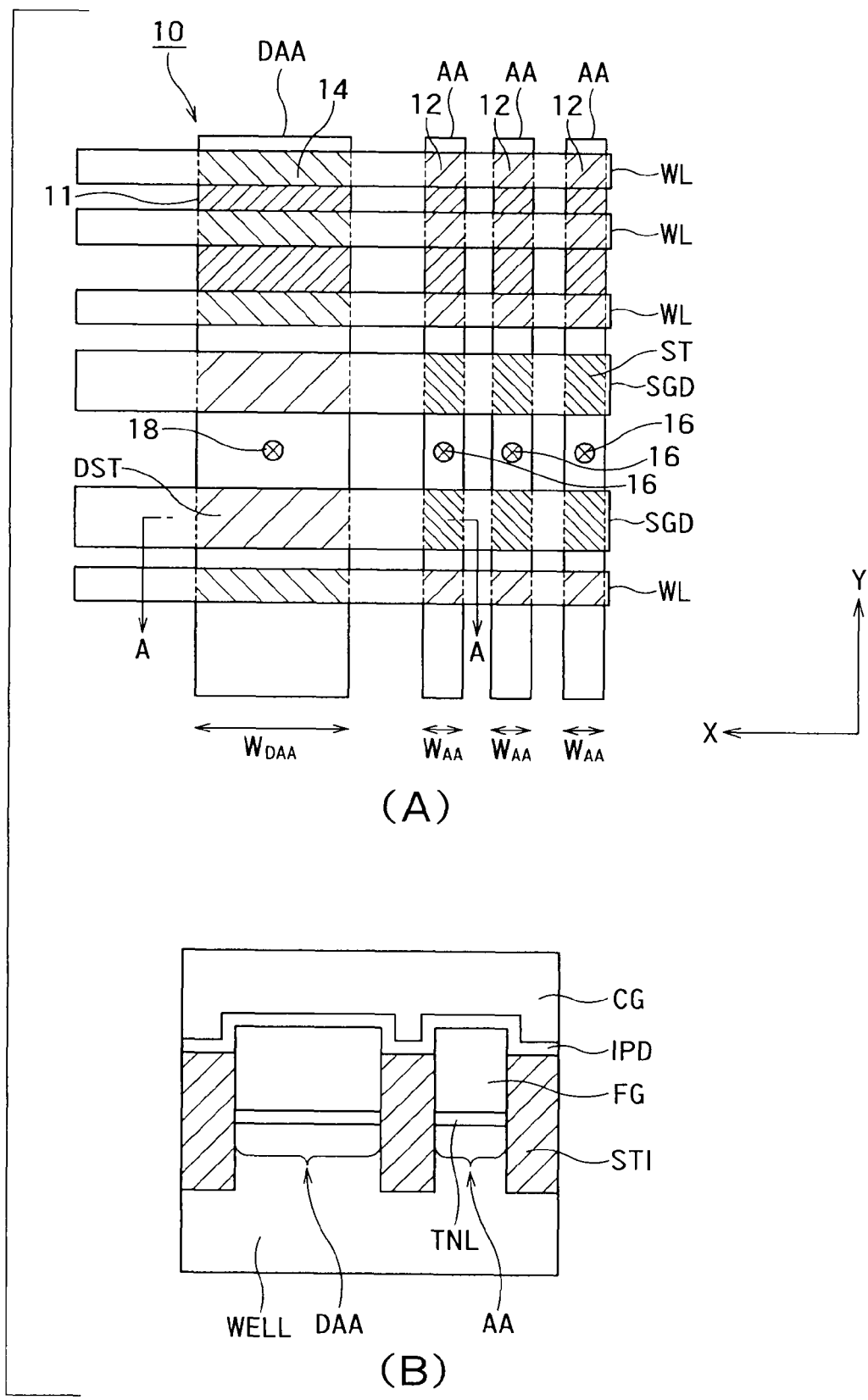
FIG. 1 is a plan view illustrating a structure of a memory cell array 10 of the nonvolatile semiconductor storage device according to the embodiment of the present invention.
Figure 2:
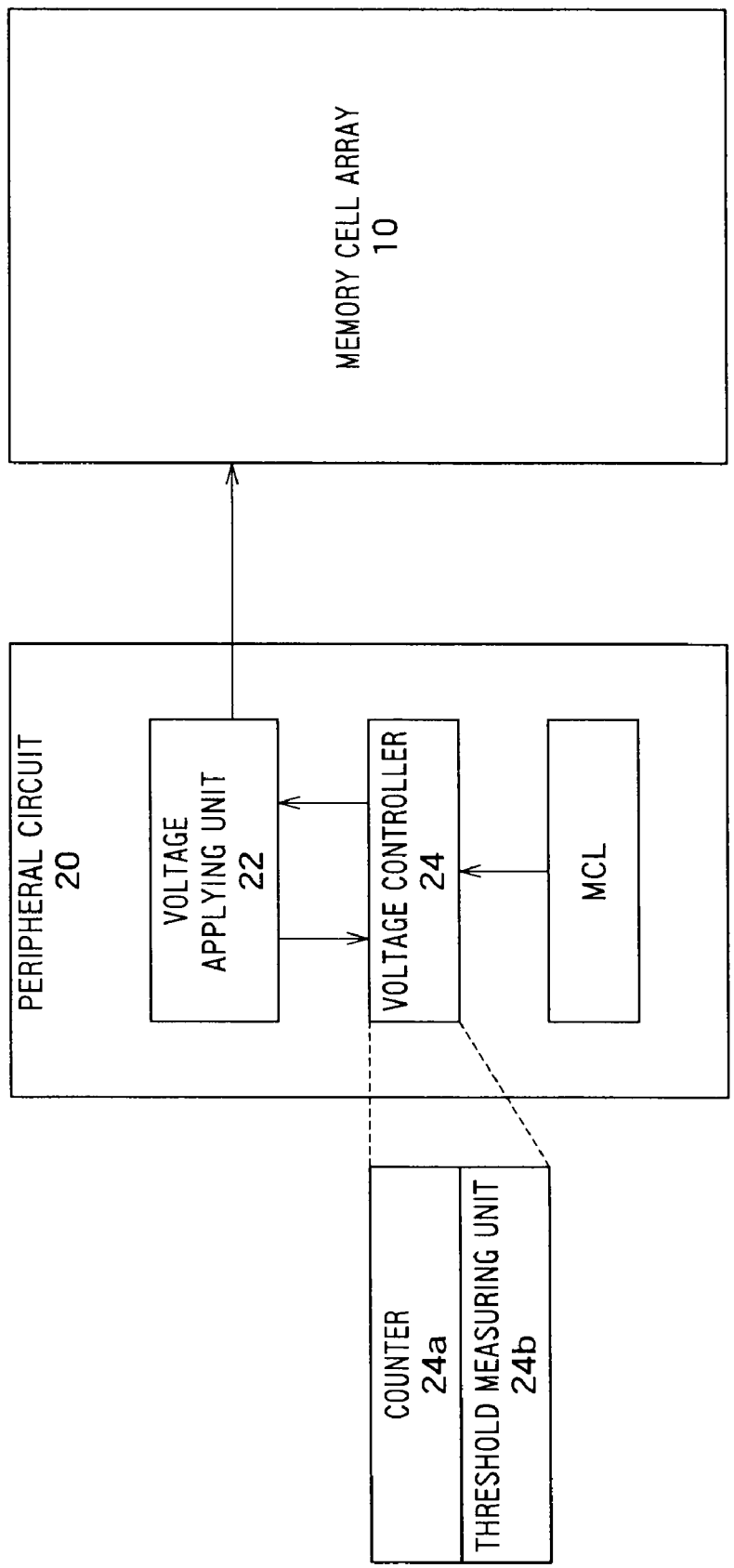
FIG. 2 is a block diagram illustrating a relationship between the memory cell array 10 of the nonvolatile semiconductor storage device according to the embodiment of the present invention and a peripheral circuit 20.

A structure of a nonvolatile semiconductor storage device according to an embodiment of the present invention will be described. FIG. 1 is a plan view illustrating a structure of a memory cell array 10 of the nonvolatile semiconductor storage device according to the embodiment of the present invention. FIG. 2 is a block diagram illustrating a relationship between the memory cell array 10 of the nonvolatile semiconductor storage device according to the embodiment of the present invention and a peripheral circuit 20.

As illustrated in FIG. 1(A), plural active areas AA extending in a first direction (Y-direction of FIG. 1(A)), a dummy active area DAA extending in the first direction, plural word lines WL extending in a second direction (X-direction of FIG. 1(A)) intersecting the first direction, a diffusion layer area 11 extending in the second direction, and a pair of selection gate lines SGD extending in the second direction are disposed in the memory cell array 10 of the nonvolatile semiconductor storage device according to the embodiment. On the active area AA, a memory cell 12 is disposed in an area intersecting the word line WL. On the active area AA, a selection gate transistor ST is disposed in an area intersecting the selection gate line SGD. On the dummy active area DAA, a dummy cell 14 is disposed in an area intersecting the word line WL. On the dummy active area DAA, a dummy selection gate transistor DST is disposed in an area intersecting the selection gate line SGD. A memory cell area (memory cell string) includes the plural memory cells 12 that are connected in series in the first direction and the selection gate transistors ST that are disposed between the plural memory cells 12. A dummy memory cell area includes plural dummy cells 14 that are connected in series in the first direction and the plural dummy selection gate transistors DST that are disposed between the plural dummy cells 14. That is, the dummy cells 14 are disposed in an end portion of the memory cell array 10. Each diffusion layer area 11 is connected to the memory cell 12 and the dummy cell 14. A first contact 16 connected to a bit line (not illustrated) is disposed in the active area AA between the selection gate transistors ST. A second contact 18 connected to the bit line is disposed in the dummy active area DAA between the dummy selection gate transistors DST. In the Y-direction, the active area AA has a width $W_{AA}$, and the dummy active area DAA has a width $W_{DAA}$ that is more than the width W. FIG. 1(B) is a sectional view taken on a line A-A of FIG. 1(A). As illustrated in FIG. 1(B), plural shallow trench isolations STI are disposed in a semiconductor substrate WELL (hereinafter occasionally referred to as "well"). The plural active areas AA and the dummy active area DAA are separated by the shallow trench isolation STI. A tunnel insulator TNL is disposed on the active area AA. The memory cell 12 is disposed on the tunnel insulator TNL. The memory cell 12 includes a floating gate FG, an inter-gate insulator IPD that is disposed on the floating gate FG, and a control gate CG that is disposed on the inter-gate insulator IPD. An upper portion of the floating gate FG is projected from an upper surface of the shallow trench isolation STI. The inter-gate insulator IPD is seamlessly disposed from the upper surface to a side face of the floating gate FG.

Similarly, the tunnel insulator TNL is disposed on the dummy active area DAA. The dummy cell 14 is disposed on the tunnel insulator TNL. The dummy cell 14 includes the floating gate FG, the inter-gate insulator IPD that is disposed on the floating gate FG, and the control gate CG that is disposed on the inter-gate insulator IPD. The upper portion of the floating gate FG is projected from the upper surface of the shallow trench isolation STI. The inter-gate insulator IPD is seamlessly disposed from the upper surface to the side face of the floating gate FG.

The control gates CG of the memory cell 12 and dummy cell 14 are commonly connected to form a word line WL. A contact area between the floating gate FG of the memory cell 12 and the inter-gate insulator IPD is smaller than a contact area between the floating gate FG of the dummy cell 14 and the inter-gate insulator IPD.

As illustrated in FIG. 2, the peripheral circuit 20 is connected to the memory cell array 10 of FIG. 1. The peripheral circuit 20 includes a memory cell controller MCL, a voltage applying unit 22, and a voltage controller 24.

The voltage applying unit 22 of FIG. 2 is worked based on a control signal transmitted from the voltage controller 24. In programming operation, the voltage applying unit 22 applies a first voltage $V_1$ for setting the memory cell 12 in a program enable state or a second voltage $V_2$ for setting the memory cell 12 in a program inhibit state to the first contact 16, and the voltage applying unit 22 applies a third voltage $V_3$ for setting the dummy cell 14 into a program-back state (for changing a threshold $V_{Dth}$ of the dummy cell 14) to the second contact 18. At this point, the voltage applying unit 22 determines the third voltage $V_3$ such that a condition of first voltage $V_1 \leqq$ third voltage $V_3$<second voltage $V_2$ (power supply voltage=Vdd) is satisfied.

The voltage controller 24 of FIG. 2 includes a counter 24a and a threshold measuring unit 24b. The number of data erasing times from the memory cell 12 is stored in the counter 24a. The data stored in the memory cells 12 are collectively erased in units of block. The number of data erasing times from the memory cell 12 means the number of data erasing times to the block in which the memory cells 12 are disposed. The threshold measuring unit 24b measures the threshold $V_{Dth}$ of the dummy cell 14. The voltage controller 24 transmits a control signal to the voltage applying unit 22 in order to apply the third voltage $V_3$ to the second contact 18 when a value n of the counter 24a reaches a predetermined value $X_n$. When the value $V_{Dth}$ measured by the threshold measuring unit 24b is lower than a predetermined value $X_V$, the voltage controller 24 transmits a control signal to the voltage applying unit 22 in order to apply the third voltage $V_3$ (for example, Vdd/2) to the second contact 18. The third voltage $V_3$ is determined based on the value $V_{Dth}$ measured by the threshold measuring unit 24b.

The second contact 18 formed by a damascene process is made of polysilicon or other metals. The second contact 18 and the first contact 16 may simultaneously be formed, or the second contact 18 and a contact of the peripheral circuit 20 may simultaneously be formed.

Figure 3:
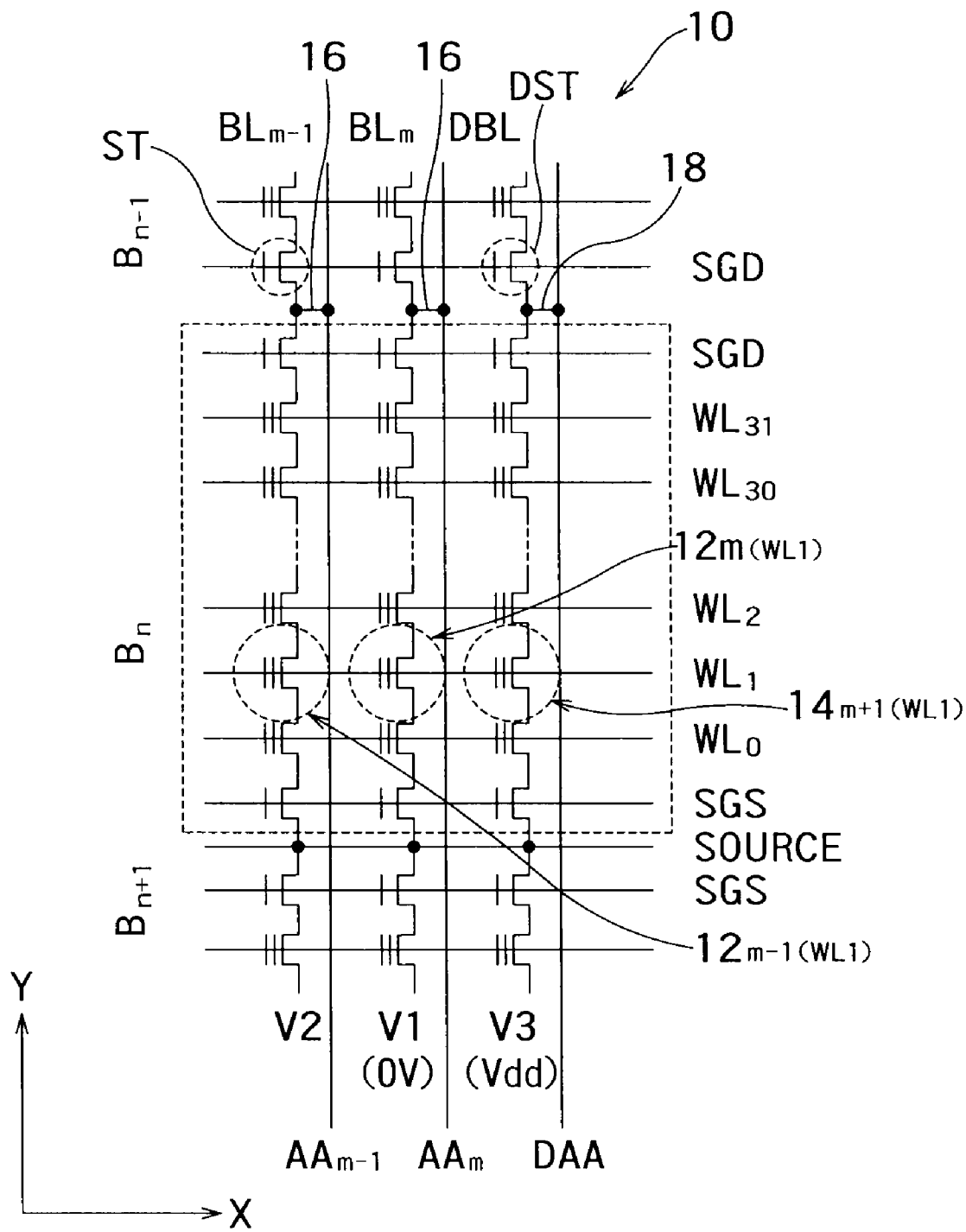
FIG. 3 is a logic circuit diagram illustrating the operation of the nonvolatile semiconductor storage device of FIG. 1.

An operation of the nonvolatile semiconductor storage device according to the embodiment will be described. FIG. 3 is a logic circuit diagram illustrating the operation of the nonvolatile semiconductor storage device of FIG. 1.

FIG. 3 illustrates an area that is of part of the memory cell array 10 and the dummy cell 14. Bit lines $BL_{m-1}$ and $BL_m$ and word lines $WL_0$ to $WL_{31}$ intersect one another in the area, and a bit line DBL and word lines $WL_0$ to $WL_{31}$ intersect one another in the dummy cell 14. The bit lines $BL_{m-1}$ and $BL_m$ are connected to the active area AA through the first contact 16. On the other hand, the bit line DBL is connected to the dummy active area DAA through the second contact 18. In the X-direction, the gate electrodes of the memory cells 12 adjacent to each other and the gate electrode of the dummy memory cell 14 adjacent to each other are connected to the word line WL. In the X-direction, the gate electrodes of the selection gate transistors ST adjacent to each other and the gate electrode of the dummy selection gate transistor DST adjacent to each other are connected to the selection gate line SGD.

It is assumed that a memory cell $12_{m(WL1)}$ disposed in a position in which the bit line $BL_m$ and the word line $WL_1$ intersect each other is in the program enable state, it is assumed that a memory cell $12_{m-1(WL1)}$ disposed in a position in which the bit line $BL_{m-1}$ and the word line $WL_1$ intersect each other is in the program inhibit state, and it is assumed that a dummy cell $14_{m+1(WL+1)}$ disposed in a position in which the bit line $BL_{m+1}$ and the word line $WL_1$ intersect each other is in the program-back state. It is assumed that the word line $WL_1$ is the selected word line. At this point, the first voltage $V_1$ is applied to the active area $AA_m$ through the first contact 16. For example, the first voltage $V_1$ is set to 0 [V]. The second voltage $V_2$ is applied to the active area $AA_{m-1}$ through the first contact 16. For example, the second voltage $V_2$ is set to 1.5 to 3.5 [V]. A voltage $V_{pgm}$ (about 20 [V]) is applied to the selected word line $WL_1$, and a pass voltage $V_{pass}$ (about 6 [V]) is applied to other word lines $WL_0$ and $WL_3$ to $WL_{31}$. The third voltage $V_3$ is applied to the dummy active area DAA through the second contact 18. For example, the third voltage $V_3$ is equal to the power supply voltage Vdd of the nonvolatile semiconductor storage device of FIG. 1.

The third voltage $V_3$ is higher than the first voltage $V_1$. Therefore, a potential at the bit line $BL_{m+1}$ including the dummy cell $14_{m+1(WL1)}$ in the program-back state is not lower than a potential at the bit line $BL_{m+1}$ including the memory cell $12_{m(1)}$ in the program enable state. A potential at the bit line DBL including the dummy cell $14_{m+1(1)}$ in the program-back state is lower than a potential at the bit line $BL_{m-1}$ including the memory cell $12_{m-1(1)}$ in the program inhibit state. Accordingly, even if the program-erase cycle is repeated in the memory cell 12 in the memory cell array 10, the threshold $V_{Dth}$ of the dummy cell $14_{m+1(1)}$ in the program enable state is set between a value (for example, −10 [V]) and the power supply voltage Vdd, where the IPD breakdown is not caused.

Figure 4:
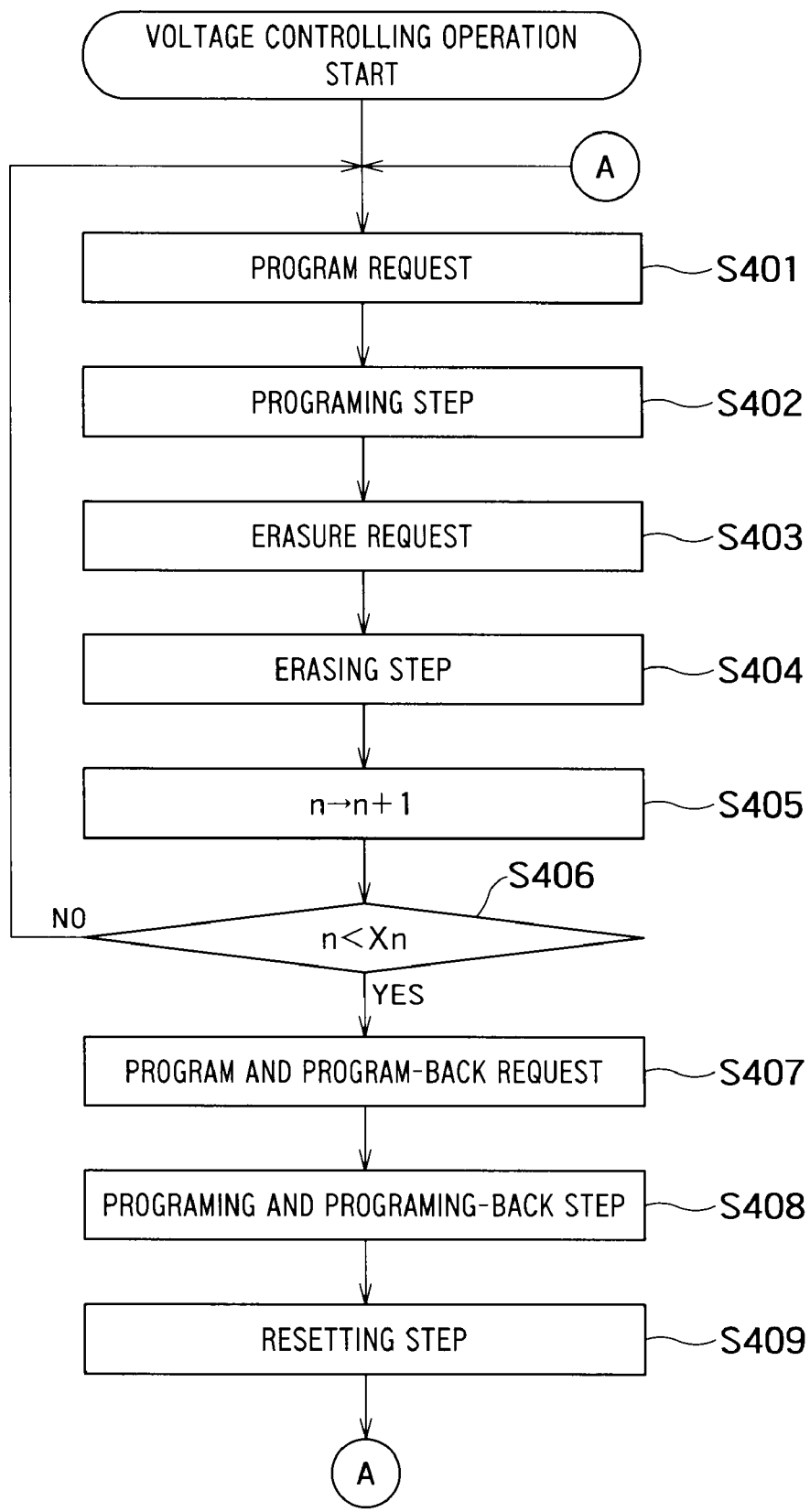
FIG. 4 is a flowchart illustrating a procedure of the voltage controlling operation based on the number of data erasing times according to the embodiment.

A voltage controlling operation in which the third voltage $V_3$ is applied to the dummy cell 14 based on the number of data erasing times will be described. FIG. 4 is a flowchart illustrating a procedure of the voltage controlling operation based on the number of data erasing times according to the embodiment.

(Write Request (S401))

The memory cell controller MCL of FIG. 2 transmits a control signal (hereinafter referred to as "program request") for a data programming in the memory cell 12 to the voltage controller 24. Then the voltage controller 24 transmits the control signal to the voltage applying unit 22 in order to apply the first voltage $V_1$ and the second voltage $V_2$ to the memory cell array 10 in a programming step (S402).

(Programming Step (S402))

In the programming step (S402), the data is stored in the memory cell 12. The voltage applying unit 22 receives the control signal transmitted from the voltage controller 24. The voltage applying unit 22 applies the first voltage $V_1$ to the first contact 16 that is connected to the memory cell 12 set in the program enable state, and applies the second voltage $V_2$ to the first contact 16 that is connected to the memory cell 12 set in the program inhibit state.

At this point, the program voltage $V_{pgm}$ (about 20 [V]) is applied to the selected word line, and the pass voltage $V_{pass}$ (about 6 [V]) is applied to the non-selected word line. As used herein, the pass voltage $V_{pass}$ is a voltage at which the transistor of the memo cell 12 becomes an on state irrespective of the threshold $V_{Mth}$ of the memory cell 12. In the programming step (S402), the third voltage $V_3$ is not applied to the second contact 18, and therefore the second contact 18 becomes a floating state. That is, in the programming step (S402), because charges are not accumulated in the dummy cell 14, the threshold $V_{Dth}$ of the dummy cell 14 does not increase.

(Erasure Request (S403))

The memory cell controller MCL transmits a control signal (hereinafter referred to as "erasure signal") for erasing the data stored in the memory cell 12 to the voltage controller 24. Then the voltage controller 24 transmits the control signal to the voltage applying unit 22 in order to apply the voltage of 0 [V] to the word line WL in units of blocks and in order to apply an erasure voltage $V_{era}$ to the well WELL of FIG. 1(B) in which the memory cells 12 are disposed in an erasing step (S404).

(Erasing Step (S404))

In the erasing step (S404), the data stored in the memory cell 12 is erased. The voltage applying unit 22 receives the control signal transmitted from the voltage controller 24. The voltage applying unit 22 applies the voltage (fifth voltage) of 0 [V] to the word line WL in units of blocks that are of erasing units of the data stored in the memory cells 12, and applies the erasure voltage $V_{era}$ (about 20 [V]) to the well WELL in which the memory cells 12 are disposed. The charges accumulated in the memory cells 12 are emitted to the well WELL by a potential difference between the word line WL and the well WELL. At this point, because the word line WL is shared by the gate electrodes of the memory cells 12 and dummy cell 14, the charges accumulated in the dummy cell 14 that is disposed in the same block as the memory cells 12 in which the data are erased are also emitted to the well WELL. As a result, the threshold of the dummy cell 14 is lowered.

(Step S405)

The value n of the counter 24a is incremented by one. That is, the value n of the counter 24a indicates the number of data erasing times in units of blocks.

(Step S406)

When the value n of the counter 24a reaches the predetermined value $X_n$ (YES in S406), the flow goes to a program and program-back request (S407). That is, the voltage controller 24 waits for the transmission of the control signal from the memory cell controller MCL in order to store the data in the memory cell 12 and in order to program-back the dummy cell 14.

On the other hand, when the value n of the counter 24a does not reach the predetermined value $X_n$ (NO in S406), the flow returns to the program request (S401). That is, the voltage controller 24 waits for the transmission of the control signal from the memory cell controller MCL in order to store the data in the memory cell 12.

(Program and Program-Back Request (S407))

The memory cell controller MCL transmits the program request and a control signal (hereinafter referred to as "program-back request") for setting the dummy cell 14 in the program-back state to the voltage controller 24. Then the voltage controller 24 transmits the control signal to the voltage applying unit 22 in order to apply the first voltage $V_1$, the second voltage $V_2$, and the third voltage $V_3$ to the memory cell array 10 in a programming and programming-back step (S408). That is, in the program and program-back request (S407), in addition to the step similar to the program request (S401), the memory cell controller MCL transmits the control signal in order to set the dummy cell 14 in the program-back state.

(Programming and Programming-Back Step (S408))

The data is stored in the memory cell 12 at the same time the data is program-back to the dummy cell 14 in programming and programming-back step (S408). The voltage applying unit 22 receives the control signal transmitted from the voltage controller 24. The voltage applying unit 22 applies the first voltage $V_1$ to the first contact 16 that is connected to the memory cell 12 set in the program enable state, applies the second voltage $V_2$ to the first contact 16 that is connected to the memory cell 12 set in the program inhibit state, and applies the third voltage $V_3$ to the second contact 18 that is connected to the dummy cell 14 set in the program-back state. As a result, the charges are accumulated in the dummy cell 14 that shares the word line WL with the memory cell 12, and the threshold $V_{Dth}$ of the dummy cell 14 increases. That is, because the charges emitted from the dummy cell 14 in the erasing step (S404) return to the dummy cell 14 in the programming and programming-back step (S408), the threshold $V_{Dth}$ of the dummy cell 14 increases before the IPD breakdown of the dummy cell 14 is caused. As a result, the IPD breakdown of the dummy cell 14 can be prevented.

(Resetting Step (S408))

The value n of the counter 24a is reset. Then the flow returns to the write request (S401). That is, the voltage controller 24 waits for the transmission of the control signal from the memory cell controller MCL in order to store the data in the memory cell 12.

In the voltage controlling operation of FIG. 4 based on the number of data erasing times, the programming and programming-back step (S408) is performed after predetermined number of times of the erasing steps (S404). That is, the dummy cell 14 is program-back when the threshold $V_{Dth}$ of the dummy cell 14 is lowered enough to cause the IPD breakdown of the dummy cell 14. This is because the threshold is not extremely lowered enough to cause the IPD breakdown of the dummy cell 14 in the one-time erasing step (S404). That is, it is not necessary to program-back the dummy cell 14 every erasing step (S404).

In the voltage controlling operation of FIG. 4 based on the number of data erasing times, because the dummy cell 14 is program-back when the threshold $V_{Dth}$ of the dummy cell 14 is lowered enough to cause the IPD breakdown, the number of the program-back times is minimum. That is, a time and electric power which are necessary to generate the third voltage $V_3$, and a voltage stress on the dummy cell 14 due to the application of the third voltage $V_3$, are minimum in preventing the IPD breakdown of the dummy cell 14.

In the voltage controlling operation of FIG. 4 based on the number of data erasing times, the data is program-back to the dummy cell 14 that shares the word line WL with the memory cell 12 in which the data is stored at the same time the data is stored in the memory cell 12 in the programming and programming-back step (S408). Therefore, the speed of the circuit operation of the nonvolatile semiconductor storage device can be enhanced in the voltage controlling operation.

Figure 5:
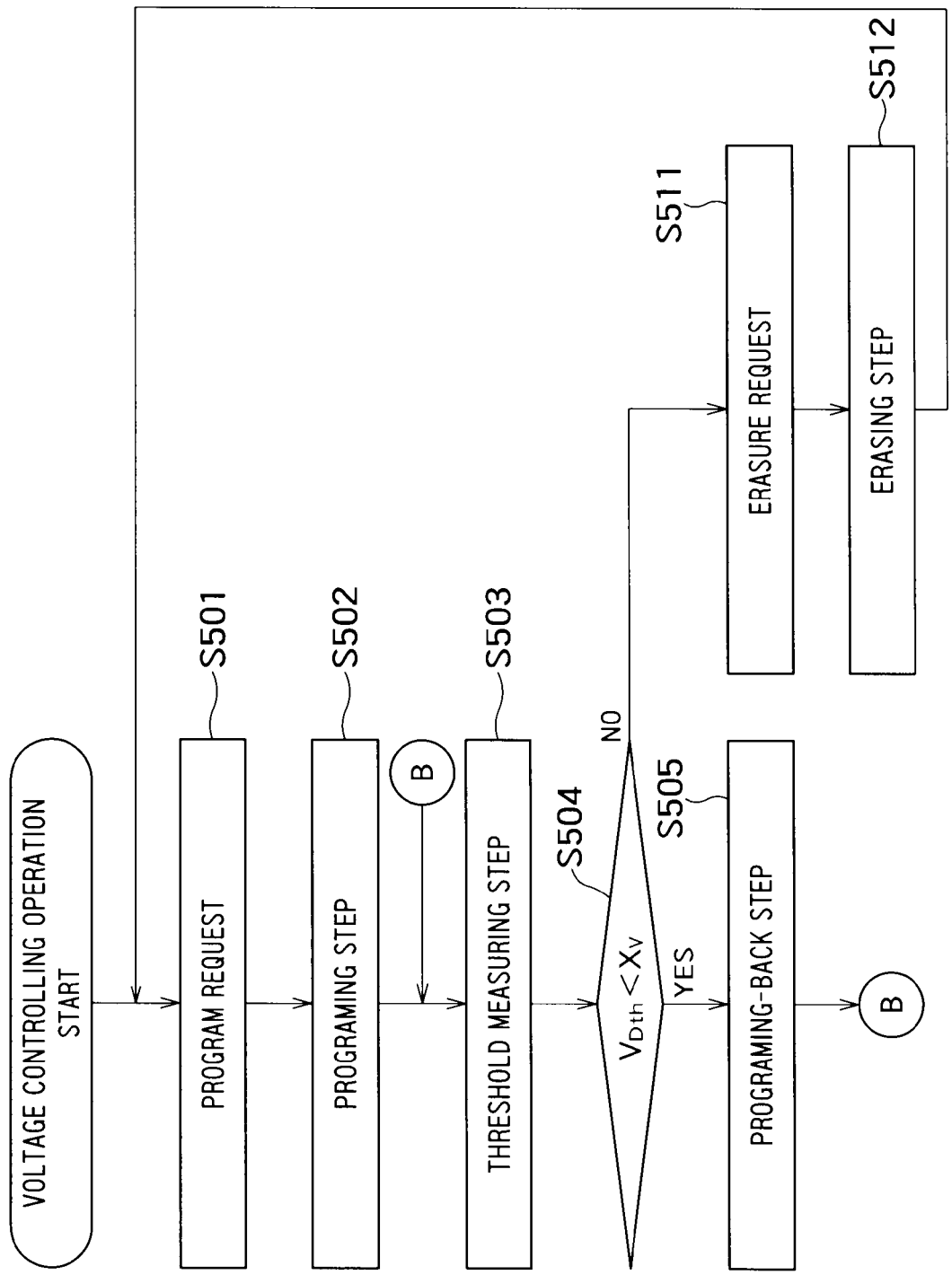
FIG. 5 is a flowchart illustrating the voltage controlling operation based on the threshold $V_{Dth}$ of the dummy cell 14 according to the embodiment.

A voltage controlling operation in which the third voltage $V_3$ is applied to the dummy cell 14 based on the threshold $V_{Dth}$ of the dummy cell 14 will be described. FIG. 5 is a flowchart illustrating the voltage controlling operation based on the threshold $V_{Dth}$ of the dummy cell 14 according to the embodiment.

(Program Request (S501))

The program request (S501) is similar to the program request (S401) of FIG. 4.

(Programming Step (S502))

The programming step (S502) is similar to the programming step (S402) of FIG. 4.

(Threshold Measuring Step (S503))

The threshold measuring unit 24b measures the threshold $V_{Dth}$ of the dummy cell 14.

(Step S504)

When the threshold $V_{Dth}$ of the dummy cell 14, which is measured by the threshold measuring unit 24b, is lower than the predetermined value $X_V$ (YES in S504), the flow goes to the programming-back step (S505). On the other hand, when the threshold $V_{Dth}$ of the dummy cell 14, which is measured by the threshold measuring unit 24b, is not lower than the predetermined value $X_V$ (NO in S504), the flow goes to the erasure request (S511). That is, the voltage controller 24 waits for the control signal for erasing the data in units of blocks from the memory cell controller MCL.

(Programming-Back Step (S505))

In the programming-back step (S505), the data is program-back to the dummy cell 14. The voltage applying unit 22 applies the third voltage $V_3$ to the second contact 18 that is connected to the dummy cell 14 set in the program-back state. As a result, the charges are accumulated in the dummy cell 14 to increase the threshold $V_{Dth}$ of the dummy cell 14. However, the first voltage $V_1$ and the second voltage $V_2$ are not applied to the contact 16, and therefore the contact 16 becomes the floating state. That is, the charge variation is not caused in the memory cell 12, and the memory cell 12 is maintained in the state in which the data is stored as directed from the controller. After the programming-back step (S505), the flow returns to the threshold measuring step (S503).

(Erasure Request (S511))

The erasure request (S511) is similar to the erasure request (S403) of FIG. 4.

(Erasing Step (S512))

The erasing step (S512) is similar to the erasing step (S404) of FIG. 4. After the erasing step (S512), the flow returns to the program request (S501). That is, the voltage controller 24 waits for the control signal for the data programming in the memory cell 12 from the memory cell controller MCL.

In the program-back step (S505), the third voltage $V_3$ may be set so as to gradually increase like so-called verify programming. In such case, the threshold $V_{Dth}$ of the dummy cell 14 reaches the predetermined value $X_V$ faster. As a result, the operating speed of the nonvolatile semiconductor storage device can be enhanced.

In the voltage controlling operation of FIG. 5 based on the threshold $V_{Dth}$ of the dummy cell 14, a determination whether the data is program-back to the dummy cell 14 is made based on the threshold $V_{Dth}$ of the dummy cell 14. At this point, the data stored in the memory cell 12 is random. Accordingly, in the programming step (S502), even if the second contact 18 becomes the floating state, the variation in threshold $V_{Dth}$ of the dummy cell 14 is generated because the second contact 18 shares the word line WL with the memory cell 12. At this point, control accuracy of the threshold $V_{Dth}$ of the dummy cell 14 can be improved by measuring the threshold $V_{Dth}$ of the dummy cell 14.

For example, a possibility of causing the IPD breakdown of the dummy cell 14 increases when the threshold $V_{Dth}$ of the dummy cell 14 becomes −10 [V] or lower. Therefore, when the threshold $V_{Dth}$ of the dummy cell 14 is lowered enough to cause the IPD breakdown of the dummy cell 14, the data is largely program-back in the dummy cell 14. On the other hand, when the threshold $V_{Dth}$ of the dummy cell 14 is not lowered enough to cause the IPD breakdown of the dummy cell 14, the data is not largely program-back in the dummy cell 14. In such cases, the voltage stress is excessively applied to the dummy cell 14 by largely program-back the dummy cell 14. Therefore, the memory cell controller MCL transmits a signal to the voltage controller 24, such that the third voltage $V_3$ of 0 [V] is applied to the second contact 18 when the threshold $V_{Dth}$ of the dummy cell 14 is lowered (about −10 [V]) enough to cause the IPD breakdown of the dummy cell 14, and such that the substantially same voltage as the second voltage $V_2$=Vdd is applied to the second contact 18 when the threshold $V_{Dth}$ of the dummy cell 14 is not lowered (for example, about ±3 [V]) enough to cause the IPD breakdown of the dummy cell 14.

In the voltage controlling operation of FIG. 5 based on the threshold $V_{Dth}$ of the dummy cell 14, only the dummy cell 14 whose threshold $V_{Dth}$ is lowered enough to cause the IPD breakdown is program-back. As a result, power consumption of the nonvolatile semiconductor storage device is reduced and the operating speed is enhanced.

According to the embodiment, the nonvolatile semiconductor storage device includes the peripheral circuit 20 including the voltage applying unit 22. The voltage applying unit 22 applies the first voltage $V_1$ for setting the memory cell 12 in the program enable state or the second voltage $V_2$ for setting the memory cell 12 in the program inhibit state to the first contact 16, and applies the third voltage $V_3$ for changing the threshold $V_{Dth}$ of the dummy cell 14 to the second contact 18. As illustrated in FIG. 3, the potential at the bit line DBL including the dummy cell $14_{m+1(1)}$ in the program-back state is not lower than the potential at the bit line $BL_{m+1}$ including the memory cell $12_{m-1(1)}$ in the program enable state. The potential at the bit line DBL including the dummy cell $14_{m+1(1)}$ in the program enable state is lower than the potential at the bit line $BL_{m-1}$ including the memory cell $12_{m-1(1)}$ in the program inhibit state. Accordingly, even if the program-erase cycle is repeated in the memory cell 12 in the memory cell array 10, the charges of the dummy cell $14_{m+1(1)}$ does not increase compared with conventional nonvolatile semiconductor storage device, and the threshold $V_{Dth}$ of the dummy cell $14_{m+1(1)}$ is not lowered. As a result, the reliability of the nonvolatile semiconductor storage device is improved by suppressing the charge increase of the dummy cell $14_{m+1(1)}$, and the IPD breakdown of the dummy cell $14_{m+1(WL1)}$ can be prevented.

According to the embodiment, the voltage applying unit 22 applies the third voltage $V_3$ to the second contact 18 when the data is erased predetermined number of times from the memory cell 12. That is, as illustrated in FIG. 4, the voltage applying unit 22 applies the third voltage $V_3$ to the second contact 18 only when it is necessary to set the dummy cell 14 in the program-back state. As a result, the voltage stress on the dummy cell 14 can be reduced while processing efficiency of the voltage controlling operation is improved.

According to the embodiment, the voltage applying unit 22 applies the third voltage $V_3$ to the second contact 18 when the threshold $V_{Dth}$ of the dummy cell 14 is lower than the predetermined value. That is, as illustrated in FIG. 5, the voltage applying unit 22 applies the third voltage $V_3$ to the second contact 18 when it is necessary to set the dummy cell 14 in the program-back state. As a result, the voltage stress on the dummy cell 14 can be reduced while processing efficiency of the voltage controlling operation is improved, and the control accuracy of the threshold $V_{Dth}$ of the dummy cell 14 can be improved.

Figure 6:
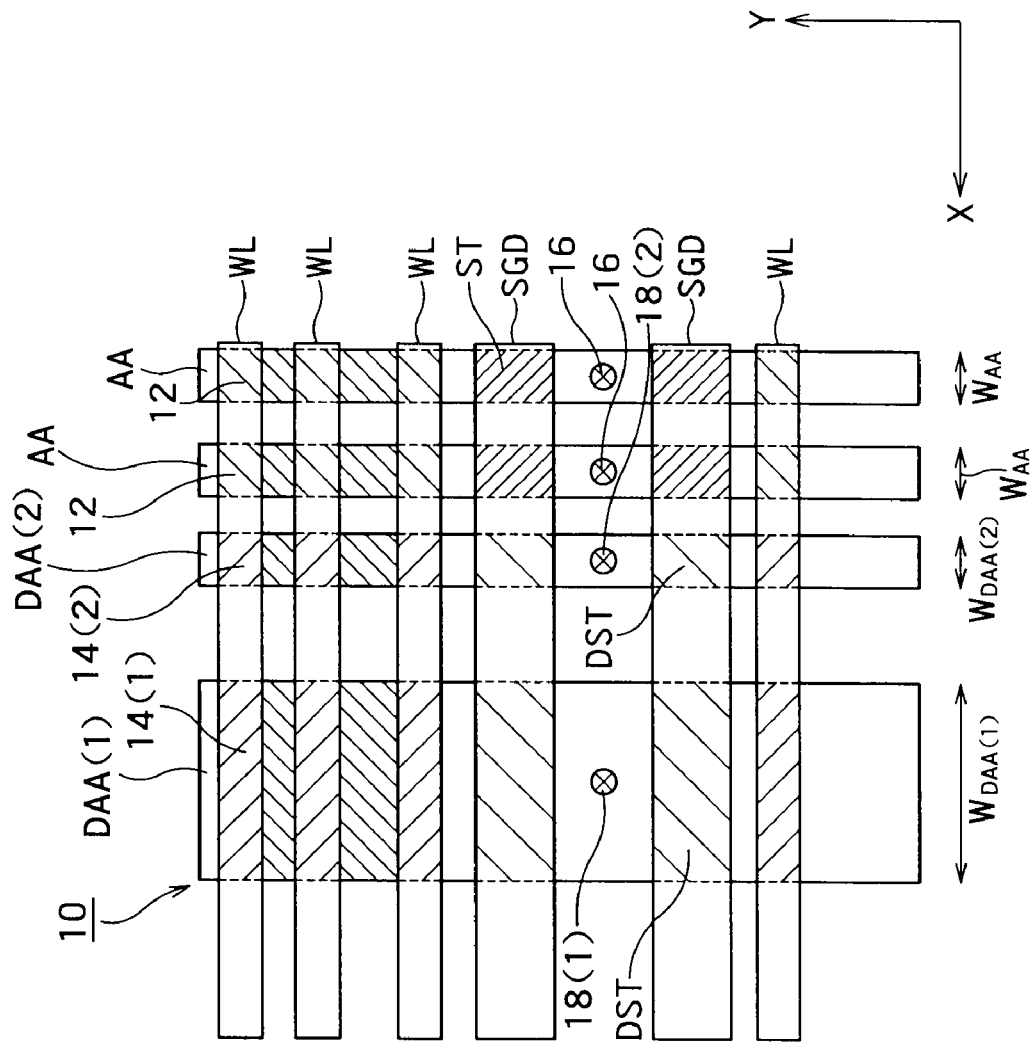
FIG. 6 is a plan view illustrating a structure of the memory cell array 10 in a nonvolatile semiconductor storage device according to the first modification of the embodiment of the present invention.

A first modification of the embodiment of the present invention will be described. Plural dummy active areas whose widths are different from one another are disposed in the first modification. FIG. 6 is a plan view illustrating a structure of the memory cell array 10 in a nonvolatile semiconductor storage device according to the first modification of the embodiment of the present invention. The description similar to that of the embodiment will not be repeated.

As illustrated in FIG. 6, plural active areas AA extending in the first direction (Y-direction of FIG. 6), plural dummy active areas DAA(1) (first dummy active area) and DAA(2) (second dummy active area) that extend in the first direction and are disposed while separated from each other at predetermined intervals in the second direction (X-direction of FIG. 6) intersecting the first direction, plural word lines WL extending in the second direction, the diffusion layer area 11 extending in the second direction, and a pair of selection gate lines SGD adjacent to the word line WL are disposed in the memory cell array 10 of the nonvolatile semiconductor storage device. On the active area AA, the memory cell 12 is disposed in the memory cell area. On the dummy active areas DAA(1) and DAA(2), dummy cells 14(1) and 14(2) are disposed in the dummy cell area. That is, the dummy cells 14(1) and 14(2) are disposed in the end portion of the memory cell array 10. Each diffusion layer area 11 is connected to the memory cell 12, the dummy cell 14(1), and the dummy cell 14(2). The first contact 16 connected to the bit line (not illustrated) is disposed in the active area AA. Second contacts 18(1) and 18(2) connected to the bit line are disposed in the dummy active areas DAA(1) and DAA(2). The active area AA has the width $W_{AA}$, the dummy active area DAA(1) has a width $W_{DAA(1)}$, and the dummy active area DAA(2) has a width $W_{DAA(2)}$ that is lower than the width $W_{DAA(1)}$.

The configuration of the peripheral circuit 20 of the first modification is also illustrated in FIG. 2. The voltage applying unit 22 according to the first modification determines the third voltage $V_3$ based on the width $W_{DAA}$ of the dummy active area DAA. For example, based on the threshold state of the dummy cell 14, the voltage applying unit 22 determines the third voltage $V_3$ that is proportional to the width $W_{DAA}$ of the dummy active area DAA. At this point, it is assumed that a third voltage $V_{3DAA(1)}$ is a voltage that is applied to the second contact 18(1) connected to the dummy active area DAA(1), and it is assumed that a third voltage $V_{3DAA(2)}$ is a voltage that is applied to the second contact 18(2) connected to the dummy active area DAA(2). In the X-direction, the gate electrodes of the memory cells 12 adjacent to each other and the gate electrodes of the dummy memory cells 14(1) and 14(2) adjacent to each other are connected to the word line WL. In the X-direction, the gate electrodes of the selection gate transistors ST adjacent to each other and the gate electrodes of the dummy selection gate transistor DST adjacent to each other are connected to the selection gate line SGD.

Because the dummy active area DAA(1) has the width $W_{DAA(1)}$ that is more than the width $W_{DAA(2)}$ of the dummy active area DAA(2), a coupling capacity of the dummy cell 14(1) is lower than that of the dummy cell 14(2), and the voltage stress is more easily applied on IPD of the dummy memory cell 14(1) comparing to the dummy memory cell 14(2). Therefore, in order to relax the voltage stress on IPD of the dummy memory cell 14(1), the third voltage $V_{3DAA(1)}$ is set larger than the third voltage $V_{3DAA(2)}$. That is, a relational expression ($0 \leq V_{3DAA(2)} < V_{3DAA(1)} < V_2 = Vdd$) holds.

The third voltage $V_{3DAA(1)}$ is proportional to the third voltage $V_{3DAA(2)}$ when the third voltage $V_{3DAA(1)}$ is identical to the third voltage $V_{3DAA(2)}$ in a film configuration of a sectional face (such as the tunnel insulator, the charge accumulation layer, and IPD).

According to the first modification, the plural dummy active areas DAA are disposed while separated from one another at predetermined intervals in the second direction intersecting the first direction, at least two of the dummy active areas DAA have the widths $W_{DAA(1)}$ and $W_{DAA(2)}$ that are different from each other, and the voltage applying unit 22 determines the third voltage $V_3$ based on the width $W_{DAA}$ of the dummy active area DAA. Because the width $W_{DAA(1)}$ of the dummy active area DAA(1) is more than the width $W_{DAA(2)}$ of the dummy active area DAA(2), the coupling capacity of the dummy cell 14(1) becomes lower than that of the dummy cell 14(2), and the voltage stress is more easily applied on IPD of the dummy cell 14(1) comparing to the dummy memory cell 14(2). Therefore, in order to relax the voltage stress on IPD of the dummy cell 14(1), the third voltage $V_{3DAA(1)}$ is set higher than the third voltage $V_{3DAA(2)}$. As a result, the IPD breakdowns of the plural dummy cells 14 are prevented. Furthermore, because the third voltage $V_3$ is applied according to the width $W_{DAA}$ of the dummy active area DAA, the control accuracy of the threshold $V_{Dth}$ of the dummy cell 14 can be improved while the voltage stresses on the dummy cells 14(1) and 14(2) are properly reduced.

Figure 7:
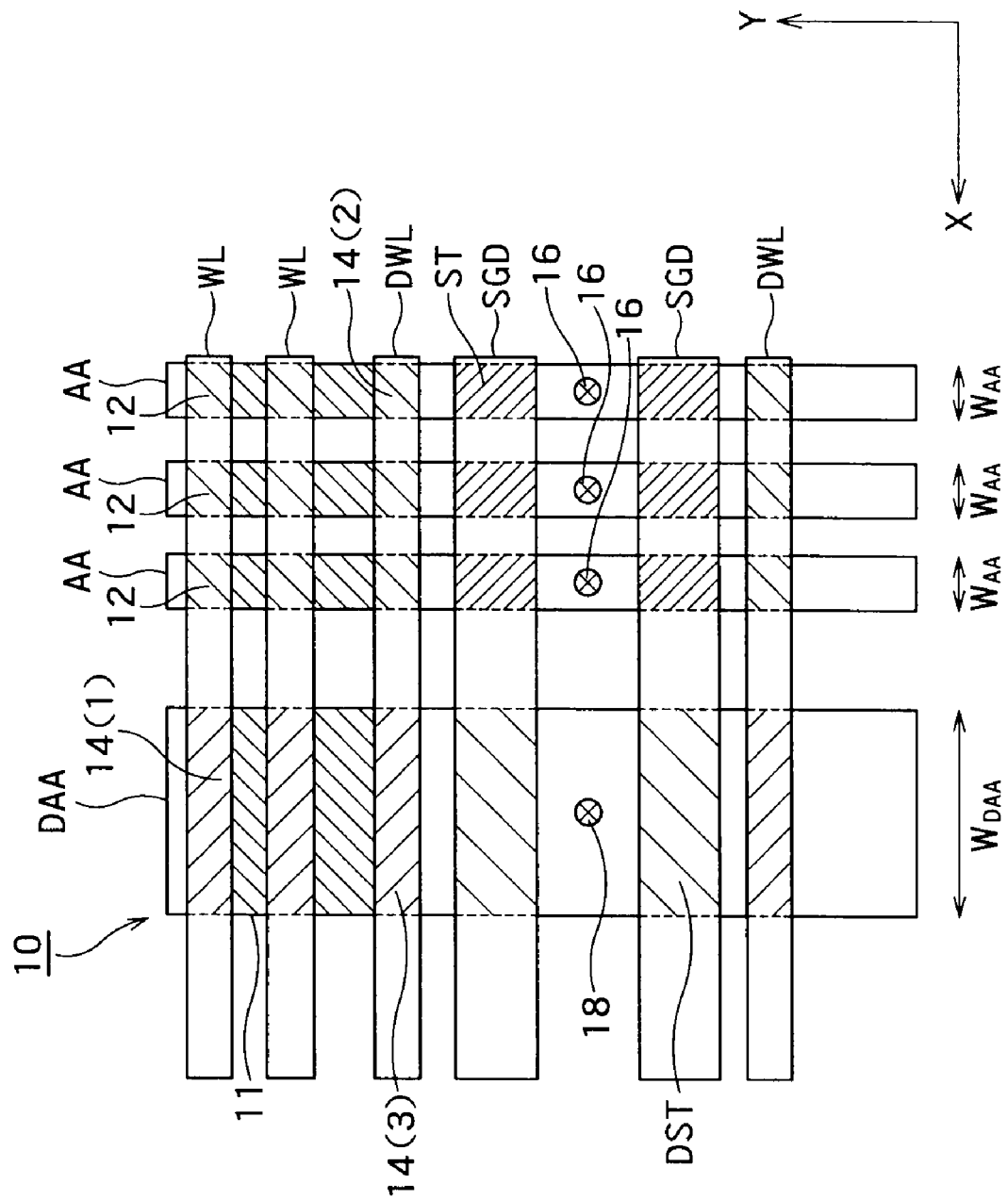
FIG. 7 is a plan view illustrating a structure of the memory cell array 10 in a nonvolatile semiconductor storage device according to the second modification of the embodiment of the present invention.

A second modification of the embodiment of the present invention will be described. In the second modification, the nonvolatile semiconductor storage device includes a dummy word line. FIG. 7 is a plan view illustrating a structure of the memory cell array 10 in a nonvolatile semiconductor storage device according to the second modification of the embodiment of the present invention. The description similar to that of the embodiment will not be repeated.

As illustrated in FIG. 7, plural active areas AA extending in the first direction (Y-direction of FIG. 7), the dummy active areas DAA extending in the first direction, plural word lines WL extending in the second direction (X-direction of FIG. 7) intersecting the first direction, the diffusion layer area 11 extending in the second direction, a pair of selection gate lines SGD extending in the second direction, and the dummy word line DWL that extends in the second direction while being adjacent to the selection gate line SGD and the word line WL are disposed in the memory cell array 10 of the nonvolatile semiconductor storage device according to the second modification. On the active area AA, the memory cell 12 is disposed in the memory cell area. On the dummy active area DAA, the first dummy cell 14(1) is disposed in the dummy cell area. The second dummy cell 14(2) is disposed in an area where the dummy word line DWL and the active area AA intersect each other. A third dummy cell 14(3) is disposed in an area where a dummy word line DL and the dummy active area DAA intersect each other. That is, the first dummy cell 14(1) and the third dummy cell 14(3) are disposed in the end portion of the memory cell array 10. The second dummy cell 14(2) is disposed in the end portion of the word line WL. Each diffusion layer area 11 is connected to the memory cell 12 and the first to third dummy cells 14(1) to 14(3). The first contact 16 connected to the bit line (not illustrated) is disposed in the active area AA. The second contact 18 connected to the bit line is disposed in the dummy active area DAA. The active area AA has the width $W_{AA}$, and the dummy active area DAA has the width $W_{DAA}$.

The gate electrodes of the memory cell 12 and first dummy cell 14(1) are connected to the word line WL. The gate electrodes of the second dummy cell 14(2) and third dummy cell 14(3), which are adjacent to each other in the X-direction, are connected to the gate electrode of the dummy word line DWL.

The configuration of the peripheral circuit 20 according to the second modification is also illustrated in FIG. 2. The voltage applying unit 22 according to the second modification applies a fourth voltage $V_4$ that is lower than the pass voltage $V_{pass}$ to the dummy word line DWL irrespective of the threshold $V_{Mth}$ of the memory cell 12.

According to the second modification, even if the plural dummy active areas DAA exist, the IPD breakdowns of the dummy cells 14 disposed on all the dummy active areas DAA can be prevented. The third voltage $V_3$ is applied according to the width of the dummy active area DAA. As a result, the control accuracy of the threshold $V_{Dth}$ of the dummy cell 14 can be improved while the voltage stress on the dummy cell 14 is reduced.

The fourth voltage $V_4$ that is lower than the pass voltage $V_{pass}$ is applied to the dummy word line DWL irrespective of the threshold $V_{Mth}$ of the memory cell 12. Therefore, the electric field applied between IPDs of the third dummy cell 14(3) decreases while the threshold increase of the second dummy cell 14(2) is prevented. As a result, the IPD breakdown of the third dummy cell 14(3) can be prevented.

The above embodiments are described only by way of example, and the invention is not limited to the embodiments. The technical scope of the invention is described only in claims, and it is noted that meanings equivalent to claims and all the modifications in claims are included in the invention. For example, when the dummy word line DWL is disposed, the IPD breakdown can be prevented in not only the dummy cell 14 on the dummy active area DAA but also the third dummy cell 14(3) whose gate electrode is connected to the dummy word line DWL.

What is claimed is:

1. A nonvolatile semiconductor storage device comprising:
   a memory cell array comprising a plurality of active areas extending in a first direction, a dummy active area extending in the first direction, a plurality of memory cells on the active areas, a plurality of first dummy cells on the dummy active area, a plurality of diffusion layer areas each connected to the corresponding memory cell and the corresponding first dummy cell, a plurality of first contacts in the respective active areas, and a second contact in the dummy active area; and
   a peripheral circuit comprising a threshold measuring unit and a voltage applying unit, wherein
   the threshold measuring unit measures a threshold of the first dummy cells, and
   the voltage applying unit applies a first voltage to set each of the memory cells in a program enable state or a second voltage to set the memory cells in a program inhibit state to each of the first contacts, and applies a third voltage to change the threshold of the first dummy cells to the second contact when the threshold measured by the threshold measuring unit is lower than a predetermined value.

2. The device of claim 1, wherein the voltage applying unit is configured to apply the third voltage to the second contact after data erase of the memory cells is conducted a predetermined number of times.

3. The device of claim 1, wherein
   the dummy active area comprises a first dummy active and a second dummy active area, the first dummy active area having a first width, the second dummy active area being separated from the first dummy active area at predetermined intervals in a second direction intersecting with the first direction and having a second width, and
   the voltage applying unit is configured to determine the third voltage based on the first width or the second width.

4. The device of claim 1, wherein a width of the dummy active area is larger than a width of the active area.

5. The device of claim 1, wherein the first voltage is equal to the third voltage or higher, and lower than the second voltage.

6. The device of claim 1, further comprising:
   a plurality of second dummy cells on the active areas;
   a plurality of word lines extending in a second direction intersecting with the first direction; and
   a dummy word line extending in the second direction and adjacent to one of the word lines, wherein
   gate electrodes of the second dummy cells are connected to the dummy word line, each of the gate electrodes being adjacent to one of the first dummy cells in the second direction is connected to the dummy word line, and
   the voltage applying unit is configured to apply a fourth voltage lower than a pass voltage to the dummy word line, the pass voltage being a voltage to turn on each of transistors of the memory cells irrespective of a threshold of each of the memory cells.

7. The device of claim 3, wherein each of the first width and the second width is larger than widths of the active areas.

8. The device of claim 7, wherein when the first width is larger than the second width, the voltage applying unit determines the third voltage to be applied to the second contact in the first dummy active area so as to be lower than the third voltage to be applied to the second contact in the second dummy active area.

9. The device of claim 1, wherein each of the memory cells and the dummy memory cell comprises a floating gate, an inter-gate insulator on the floating gate, and a control gate on the inter-gate insulator.

10. The device of claim 9, wherein a contact area between the floating gate and the inter-gate insulator of the memory cells is smaller than a contact area between the floating gate of the dummy cell and the inter-gate insulator.

11. The device of claim 5, further comprising:
a plurality of second dummy cells on the active areas;
a plurality of word lines extending in a second direction intersecting with the first direction; and
a dummy word line extending in the second direction and adjacent to one of the word lines, wherein
gate electrodes of the first dummy cells are connected to the dummy word line,
a gate electrode of the second dummy cell adjacent to one of the first dummy cells in the second direction is connected to the dummy word line,
the voltage applying unit is configured to apply a fourth voltage lower than a pass voltage to the dummy word line, the pass voltage being a voltage to turn on each of transistors of the memory cells irrespective of a threshold of each of the memory cells.

12. The device of claim 1, wherein the third voltage is a voltage to program-back for the first dummy cells.

13. A method for controlling a nonvolatile semiconductor storage device comprising a memory cell array comprising a plurality of active areas extending in a first direction, a dummy active area extending in the first direction, a plurality of memory cells on the plurality of active areas, a plurality of first dummy cells on the dummy active area, a plurality of diffusion layer areas connected to the corresponding memory cell and the corresponding first dummy cell, a plurality of first contacts in the plurality of active areas, and a second contact in the dummy active area, and the device connected to a memory cell controller, the method comprising:
applying a first voltage or a second voltage to each of the first contacts;
setting the second contact in a floating state;
erasing data of one of the memory cells and data of the first dummy cell; and
applying the first voltage or the second voltage to each of the first contacts and the third voltage to the second contact after a control signal of data programming in a memory cells is transmitted from the memory cell controller.

14. The method of claim 13, wherein the first voltage is equal to the third voltage or higher, and is lower than the second voltage.

15. The method of claim 13, wherein the second voltage is higher than a power supply voltage.

16. The method of claim 13, wherein
each of the memory cells is connected to one of the first dummy cells through a common word line, and
in applying the first voltage or the second voltage to each of the first contacts and the third voltage to the second contact, a fourth voltage lower than a pass voltage is applied to the word line, the pass voltage being a voltage at which each of transistors of the memory cells becomes an on state irrespective of a threshold of each of the memory cells.

17. The method of claim 16, wherein in erasing the data, a fifth voltage is applied to the word line and an erasure voltage higher than the fifth voltage is applied to a well.

18. The method of claim 13, wherein the first voltage or the second voltage is applied to each of the first contacts and the third voltage is applied to the second contact based on a number of data erasing times.

19. The method of claim 13, wherein the third voltage is a voltage to program-back for the first dummy cells.

* * * * *